United States Patent
Kajita

(10) Patent No.: US 7,688,098 B2
(45) Date of Patent: Mar. 30, 2010

(54) POWER SUPPLY NOISE MEASURING CIRCUIT AND POWER SUPPLY NOISE MEASURING METHOD

(75) Inventor: Mikihiro Kajita, Tokyo (JP)

(73) Assignee: NEC Corporation, Tokyo (JP)

( * ) Notice: Subject to any disclaimer, the term of this patent is extended or adjusted under 35 U.S.C. 154(b) by 194 days.

(21) Appl. No.: 12/041,315

(22) Filed: Mar. 3, 2008

(65) Prior Publication Data

US 2008/0218195 A1 Sep. 11, 2008

(30) Foreign Application Priority Data

Mar. 8, 2007 (JP) .............................. 2007-059289

(51) Int. Cl.
*G01R 31/26* (2006.01)
(52) U.S. Cl. .................................... 324/763; 324/158.1
(58) Field of Classification Search ....................... None
See application file for complete search history.

(56) References Cited

U.S. PATENT DOCUMENTS

| | | | | |
|---|---|---|---|---|
| 6,823,293 | B2 * | 11/2004 | Chen et al. .................. | 702/191 |
| 7,116,114 | B2 * | 10/2006 | Kajita ......................... | 324/613 |
| 7,355,429 | B2 * | 4/2008 | Jenkins et al. .............. | 324/763 |
| 7,355,435 | B2 * | 4/2008 | Ferraiolo et al. ............ | 324/771 |
| 7,365,548 | B2 * | 4/2008 | Neuman ...................... | 324/613 |
| 2007/0164754 | A1 * | 7/2007 | Smith et al. ................. | 324/613 |

FOREIGN PATENT DOCUMENTS

| | | |
|---|---|---|
| JP | SHO 60-034430 | 2/1985 |
| JP | HEI 09-083582 | 3/1997 |
| JP | 2001-051065 | 2/2001 |
| JP | 2005-249408 | 9/2005 |

* cited by examiner

*Primary Examiner*—Vinh P Nguyen
(74) *Attorney, Agent, or Firm*—Scully, Scott, Murphy & Presser, P.C.

(57) ABSTRACT

A power supply noise measuring circuit and measuring method are provided which are capable of evaluating a frequency component of power supply noise that affects performance and functions in a circuit by using a cross-correlation function. The power supply noise measuring circuit includes a SIN wave generating circuit which generates a sine wave signal having a variable frequency in a constant amplitude, a cross-correlation processing circuit which calculates and output a cross-correlation function between power supply noise and a sine wave signal fed from the SIN wave generating circuit, a comparator which compares a cross-correlation function output with a specified threshold voltage and which generates an output when the cross-correlation function output exceeds the threshold voltage, and a counter which counts the number of occurrences of the output from the comparator within a specified time of period.

18 Claims, 10 Drawing Sheets

ODDD Reference Unit

ODDD Detector Module

Datapath slowdown with clock distribution filter removed

US 7,688,098 B2

POWER SUPPLY NOISE MEASURING CIRCUIT AND POWER SUPPLY NOISE MEASURING METHOD

INCORPORATION BY REFERENCE

This application is based upon and claims the benefit of priority from Japanese Patent Application No. 2007-059289, filed on Mar. 8, 2007, the disclosure of which is incorporated herein in its entirely by reference.

BACKGROUND OF THE INVENTION

1. Field of the Invention

The present invention relates to power supply noise measuring circuit and power supply noise measuring method, which are capable of evaluating a frequency component of power supply noise by using a cross-correlation function.

2. Description of the Related Art

In recent years, fluctuation in an amount of a current consumed by a microprocessor is increasing due to a rise in its operating frequency and to an increase in the number of mounted transistors and, as a result, power supply noise tends to increase. The increase of power supply noises causes various adverse effects such as an increase in an amount of signal delay in a critical path of an LSI (Large Scale Integration circuit), a decrease in a transmission margin of a high-speed I/O (Input/Output) circuit caused by increased clock jitters, or a like and, in the worst case, causes malfunctions of a circuit and there is a fear that an LSI does not function properly.

In order to avoid such a situation as above, conventionally, a method is employed, as a means to reduce noise, in which a decoupling capacitor is mounted within an LSI and a charge is supplied from the decoupling capacitor immediately when a change occurs in a generated power supply voltage to suppress the change in the power supply voltage.

In circuit designing as a countermeasure against noise, LSI chips are first produced based on an analysis on the estimation of noise and, if the countermeasure proves to be insufficient, the flow of processes is controlled so that the noise estimation result is fed back again to the stage of the LSI designing. However, in the estimation of an amount of noise, when a frequency of noise is low, if noise is measured outside the LSI (in the LSI package or on the mounting board), a problem related to measurement accuracy does not arise. In recent years, however, as a frequency of noise becomes higher, the noise measurement outside the LSI has become insufficient in terms of accuracy. Moreover, due to a decrease in a design margin occurring as an operating frequency of an LSI chip becomes higher, if a change in a power supply voltage is factored into a margin in logic delay designing in LSIs, some cases appear in which logic design does not converge in a critical path.

To achieve circuit designing with a countermeasure against noise, measurement of noise is required and, when power supply noise is to be measured outside an LSI, it is impossible to probe a high-frequency component of noise with high accuracy and, therefore, in many cases, the measurement is made by using a blunt waveform of noise. Moreover, when power supply noise is to be measured inside LSIs, many measuring methods using a circuit assembled by directing attention to a magnitude of noise are disclosed, however, only the magnitude of noise cannot be used as a direct index of indicating how noise affects performance of the LSI.

In the circuits shown in FIGS. 9A and 9B disclosed by Ali Muhtaroglu et. al of INTEL at the VLSI symposium 2003, a rough waveform of noise is produced within LSIs and, as shown in FIG. 10, an amount of noise is measured. However, there is a report by Tawfik Rahal-Arrabi of INTEL at the VLSI symposium 2005 that, even if an amount of noise increased, no great difference in the maximum operating frequency of an LSI was found (see FIG. 11). That is, a learned society's knowledge that noise amounts are not directly related to degradation of LSI performance is generally spreading.

In the circuits shown in FIGS. 9A and 9B, by applying a reference current from the Reference Unit shown in FIG. 9A, throwing-off of a balance between I ref+ and I ref− is monitored by the Detector Module shown in FIG. 9B and a differential of a shift is digitized to be outputted. FIG. 10 shows outputs from the circuits shown in FIGS. 9A and 9B and fluctuations on the Vcc side are detected on the Vref1 side and fluctuations on the Vss are detected on the Vref2. That is, fluctuations of Vcc (Iref+) and Vss (Iref−) are seen from the reference voltage side. Moreover, in FIG. 10, its upper part shows a profile of a power supply and a profile of GND and its lower part shows results from measurement by using the INTEL circuit shown in FIGS. 9A and 9B.

Moreover, FIGS. 11A and 11B show the evaluation of results from a simulation by assembling specified circuits in INTEL for logic signal delay in an LSI. FIG. 11A shows an example in which, between a case of the connection of an RC (Resistor-Capacitor) filter to separate a global clock power supply from a core clock power supply in a pseudo manner and a case of no connection of the filter, a comparison as to whether or not the connection of the filter affects performance of a data path (logic) is made by performing a simulation. The example is based on a prediction that, if a state occurs in which a clock power supply is affected by the core logic power supply, since fluctuations of the core logic power supply are larger than those of the clock power supply, a time fluctuation of a global clock becomes larger, which would affect logic delay. Also, FIG. 11B shows an effect on a data path when an RC filter is removed and also shows, since data transfer is made impossible unless an operating frequency is lowered, a result from the checking of a degree of performance degradation occurring when the operating frequency is lowered. The result shows that degradation of performance is about several percentages at most and, therefore, this result cannot be explained well unless a discussion is made after a frequency of noise is exactly understood.

In addition to the above, in Patent Reference 1 (Japanese Patent Application Laid-open No. 2001-051065, FIG. 1, Paragraph [0015]), a lightning noise identifying method at a time of observing real time data is disclosed in which real time data is observed and a cross-correlation value is calculated among observed components in every observation step and the calculated cross-correlation value is compared with a threshold and, when the cross-correlation value exceeds a threshold value, it is judged that a lightning noise is contained in the observed real time data.

Thus, according to the Patent Reference 1, at the time of observing real time data, even if a lightning noise is contained in observed data, identification between an original observed data and a lightning noise is made possible. However, in the Patent Reference 1, there is no description of technology that, by evaluating a frequency component of power supply noise using a cross-correlation function, noise affecting performance of an LSI can be evaluated within the LSI.

Also, power supply noise measuring device is disclosed in Patent Reference 2 (Japanese Patent Application Laid-open No. 2005-249408, Paragraph [0030]) in which a signal fed from power supply line is passed through a HPF (High Pass Filter) and a divided voltage is added to the signal to generate the first signal and the second signal obtained by adding a divided signal to an identified voltage and a comparator outputs a result from comparison between a voltage of the first signal and a voltage of the second signal and a counter counts up voltages when a voltage of the first signal is a voltage of the second signal or more and a sample holding circuit sample-holds a count value immediately before resetting of a counter.

Thus, according to the power supply noise measuring device disclosed in Patent Reference 2, an amount of power supply noise with a high frequency can be measured on chips (on an LSI) and sudden peak noise can be obtained and its output is a rapid signal and can be taken out to the outside. However, in the Patent Reference 2, there is no description of technology that, by evaluating a frequency component of power supply noise using a cross-correlation function, noise affecting performance of an LSI can be evaluated within the LSI.

A flow measuring method and a flow measuring device are disclosed in Patent Reference 3 (Japanese Patent Application Laid-open No. Sho 60-034430, Figures, left upper column L11 to right upper L11 on page 6) for measuring a flow of a fluid between an input point of a system and an output point of a system, the method of which includes a process of adding an indicated physical amount of a known stochastic exciting signal to a fluid at the input point of the system, a process of obtaining a response signal by detecting a fluid response depending on time with respect to the exciting signal at the output point of the system, a process of obtaining a cross-correlation function by cross-correlating the exciting signal with the response signal, a process of taking out a signal representing a flow rate from information about an indicated physical amount of a cross correlating signal and exciting signal, and a process of feeding the signal representing the flow to a signal using unit.

Thus, according to the technology disclosed in Patent Reference 3, by adding a stochastic exciting signal to the input of the system to generate a measurable output signal at an exit on a downstream side of the system, a uniform flow like a blood in particular is measured and by analyzing cross-correlation between an exciting signal and an output signal, a flow rate can be calculated. However, in the Patent Reference 3, there is no description of technology that, by evaluating a frequency component of power supply noise using a cross-correlation function, noise affecting performance of an LSI can be evaluated within the LSI.

Moreover, a spectrum dispersion transmission system and signal receiving device are disclosed in Patent Reference 4 (Japanese Patent Application Laid-open No. Hei 09-083582, paragraphs [0006] and [0038], formula 2), the signal receiving device of which includes a mixer to get a product obtained by multiplying a sine wave and cosine wave taken out from a reference carrier wave being synchronized with a transmission-side carrier wave by a receiving wave, a matched filter to realize correlation by multiplying a low frequency component of the sine wave and cosine wave output from the mixer by standby I, Q patterns produced from pseudo noise signal systems each having the same period and different phase, and a phase detector to obtain a demodulated output from the matched filter output and, the transmission device of which includes a pattern generator containing a pattern to realize phase transition by the standby I, Q patterns generated from the pseudo noise signal system on the signal-receiving side, a switching device to perform switching between a digital signal for transmission and a pattern generator output, a modulator to modulate an output from the switching device.

Thus, unlike standby patterns of the related receiving device which are not PN (Pseudo Noise) system causing a high probability of erroneous synchronization, there is a low probability of erroneous synchronization in the transmitting and receiving devices disclosed in Patent Reference 4. However, in the Patent Reference 4, there is no description of technology that, by evaluating a frequency component of power supply noise using a cross-correlation function, noise affecting performance of an LSI can be evaluated within the LSI.

The problem is that the learned society's knowledge that noise amounts calculated by the related power supply noise measuring circuit and measuring method are not directly related to degradation of LSI performance is generally spreading.

SUMMARY OF THE INVENTION

In view of the above, it is an object of the present invention to provide a power supply noise measuring circuit and a power supply noise measuring method, which are capable of evaluating a frequency component of power supply noise that affects performance of an LSI by using a cross-correlation function.

According to a first aspect of the present invention, there is provided a power supply noise measuring circuit including:

a sine wave generating circuit which generates a sine wave signal having a variable frequency in constant amplitude, a cross-correlation function calculating circuit which calculates and output a cross-correlation function between a power supply noise and a sine wave signal fed from the sine wave generating circuit, a comparator which compares an output of the cross-correlation function with a specified threshold voltage and which produces an output when the output of the cross-correlation function has exceeded the threshold voltage, and a counter which counts the number of occurrences of an output from the comparator within a predetermined period of time;

wherein the power supply noise measuring circuit is configured so as to verify a noise frequency component affecting a delay in a logic circuit and/or an operation of an analog circuit by changing a sine wave frequency of the sine wave generating circuit based on results from counting done by the counter.

According to a second aspect of the present invention, there is provided a power supply noise measuring method including:

generating a sine wave signal having a variable frequency in a constant amplitude, calculating and outputting a cross-correlation function between power supply noise and the sine wave signal;

comparing an output of the cross-correlation function with a specified threshold voltage and producing an output showing detection that the output of the cross-correlation function has exceeded the threshold voltage, and counting the number of occurrences of the output showing the detection within a predetermined period of time;

wherein a noise frequency component affecting a delay in a logic circuit and/or an operation of an analog circuit is verified by changing a sine wave frequency based on results from the counting.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EXEMPLARY EMBODIMENTS

Introduction

To solve the above problems, the measuring circuit and measuring method using the same are provided which are capable of measuring, within an LSI, to what degree noise having a specified frequency component that would most affect performance of the LSI is contained. A clock circuit affecting delay timing of a signal within an LSI is ordinarily classified into two types, one being a global clock circuit and a local clock circuit to be used in a circuit to perform high-speed logic operation such as a data path or a like and to what degree a clock of the high-speed logic operation circuit has jitters is an important factor for ensuring a margin when a design of delay time of signal data is done within an LSI.

Figure 6:
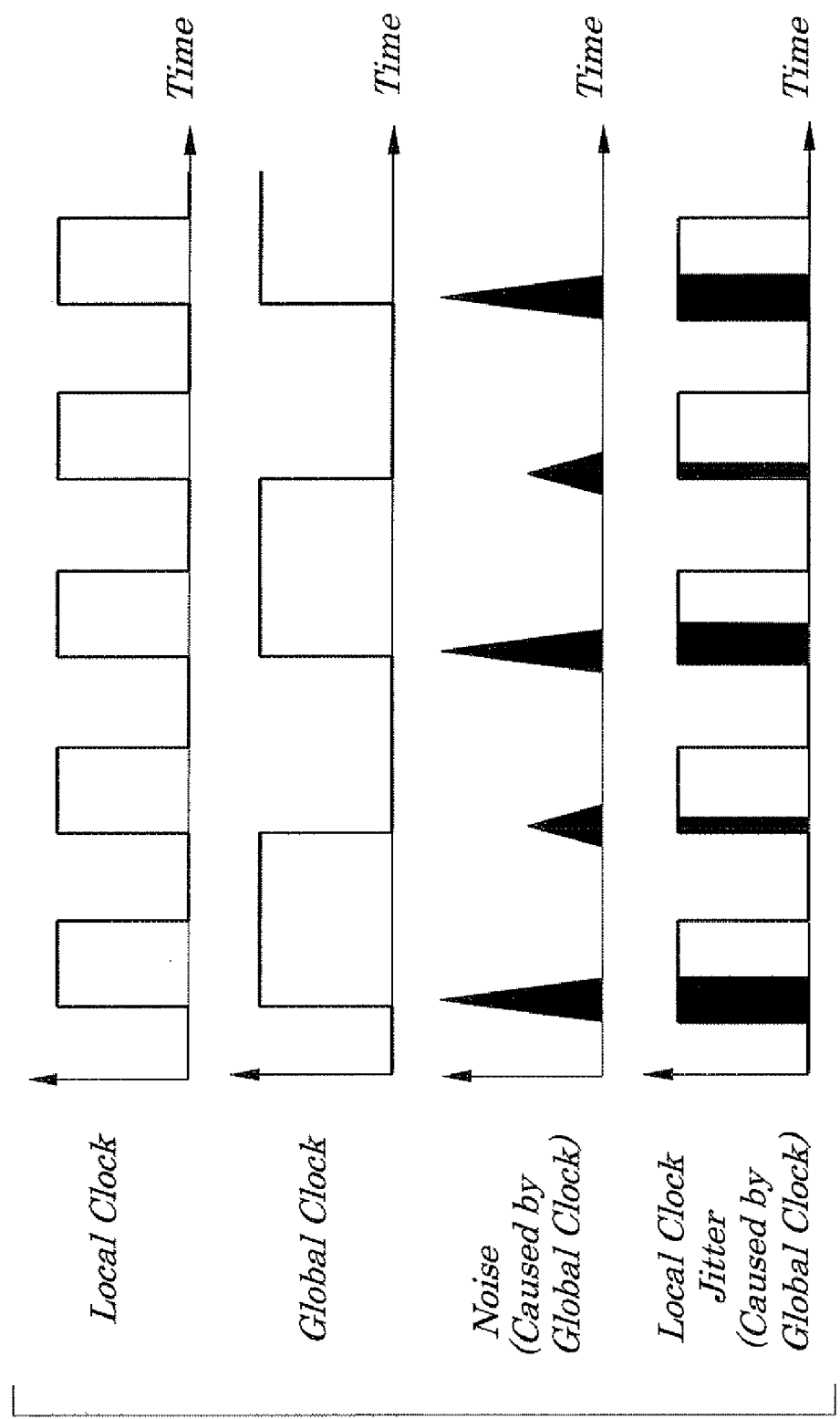
FIG. 6 is a diagram explaining an extraction of a noise component according to the first exemplary embodiment of the present invention.

Ordinarily, it is often the case that a frequency of a local clock is two times higher than that of a global clock. At this point of time, as shown in FIG. 6, the local clock is affected once in two periods by noise caused by the global clock and, as a result, a phenomenon occurs in which a frequency of a local clock changes in every period, which is seen as a jitter, and therefore, if an amount of change (jitter) is large, there is a possibility that no high-speed logic operation is performed. That is, a component making up one half of a frequency of the local clock exerts a great influence and other frequency components exert almost no influence. Therefore, an amount of noise having a critical frequency is important and, even if an amount of other frequency components is large, there is no problem. The power supply noise measuring circuit and measuring method of power supply noises are provided based on such principles as described above.

Best modes of carrying out the present invention will be described in further detail using various exemplary embodiments with reference to the accompanying drawings. A power supply noise measuring circuit includes a sine wave generating circuit to generate a sine wave signal having a variable frequency in a constant amplitude, a cross-correlation function calculating circuit to calculate and output a cross-correlation function between power supply noise and a sine wave signal fed from the sine wave generating circuit, a comparator to compare an output of the cross-correlation function with a specified threshold voltage and to produce an output when the output of the cross-correlation function has exceeded the threshold voltage, and a counter to count the number of occurrences of an output from the comparator within a predetermined period of time, wherein the power supply noise measuring circuit is configured so as to verify a noise frequency component affecting a delay in a logic circuit and/or an operation of an analog circuit.

With the above configuration, it is made possible to analyze occurrence frequency of a frequency component being greatly affected by a power supply noise within an LSI and, by measuring an amount of noise practically affecting a circuit, an efficient countermeasure against power supply noises and designing guidance are obtained, which causes a case to appear in which a designing margin can be relaxed, thereby achieving low-cost design.

First Exemplary Embodiment

Figure 1:
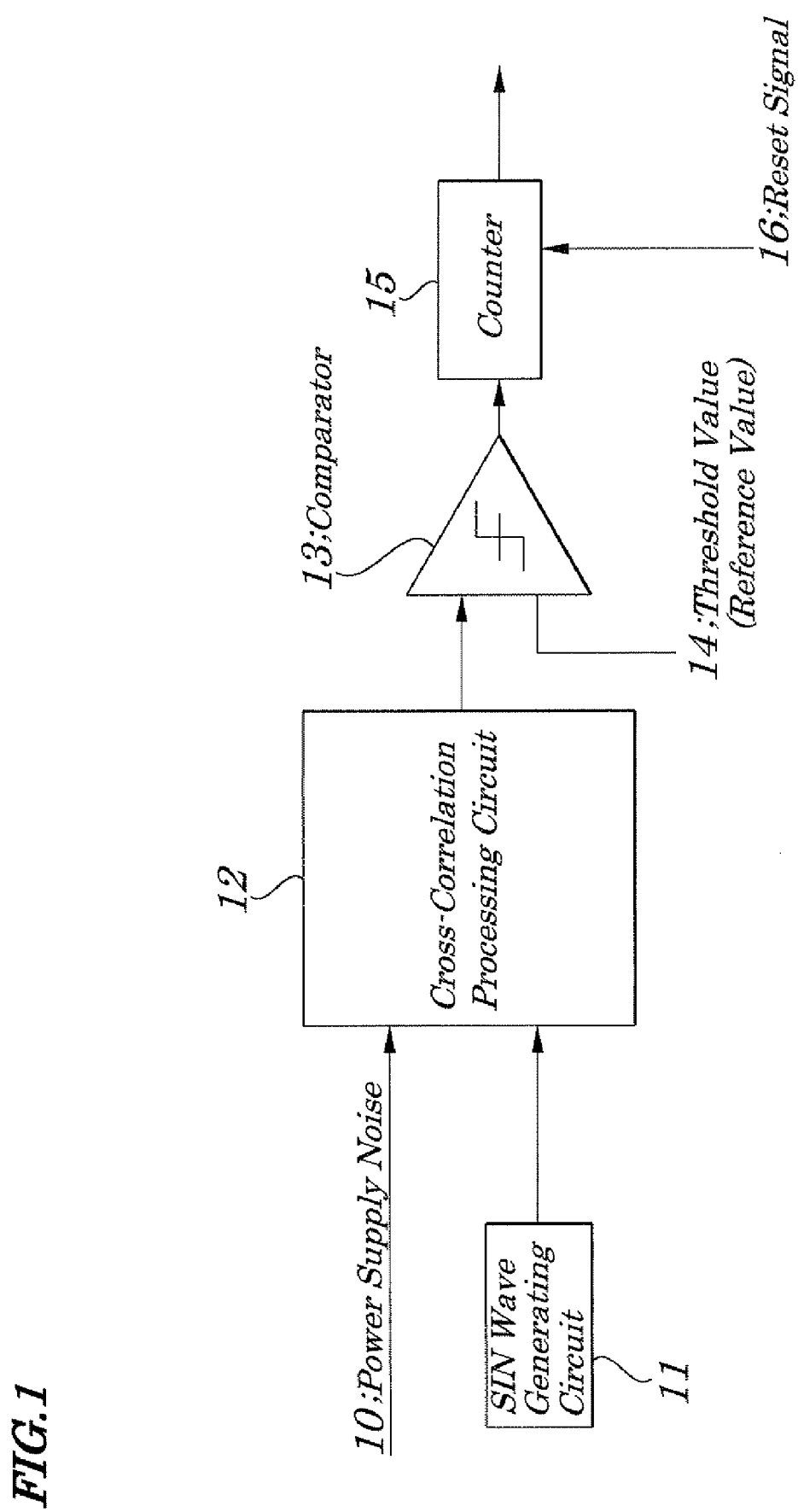
FIG. 1 is a block diagram showing configurations of an entire power supply noise measuring circuit according to the first exemplary embodiment of the present invention.
Figure 2:
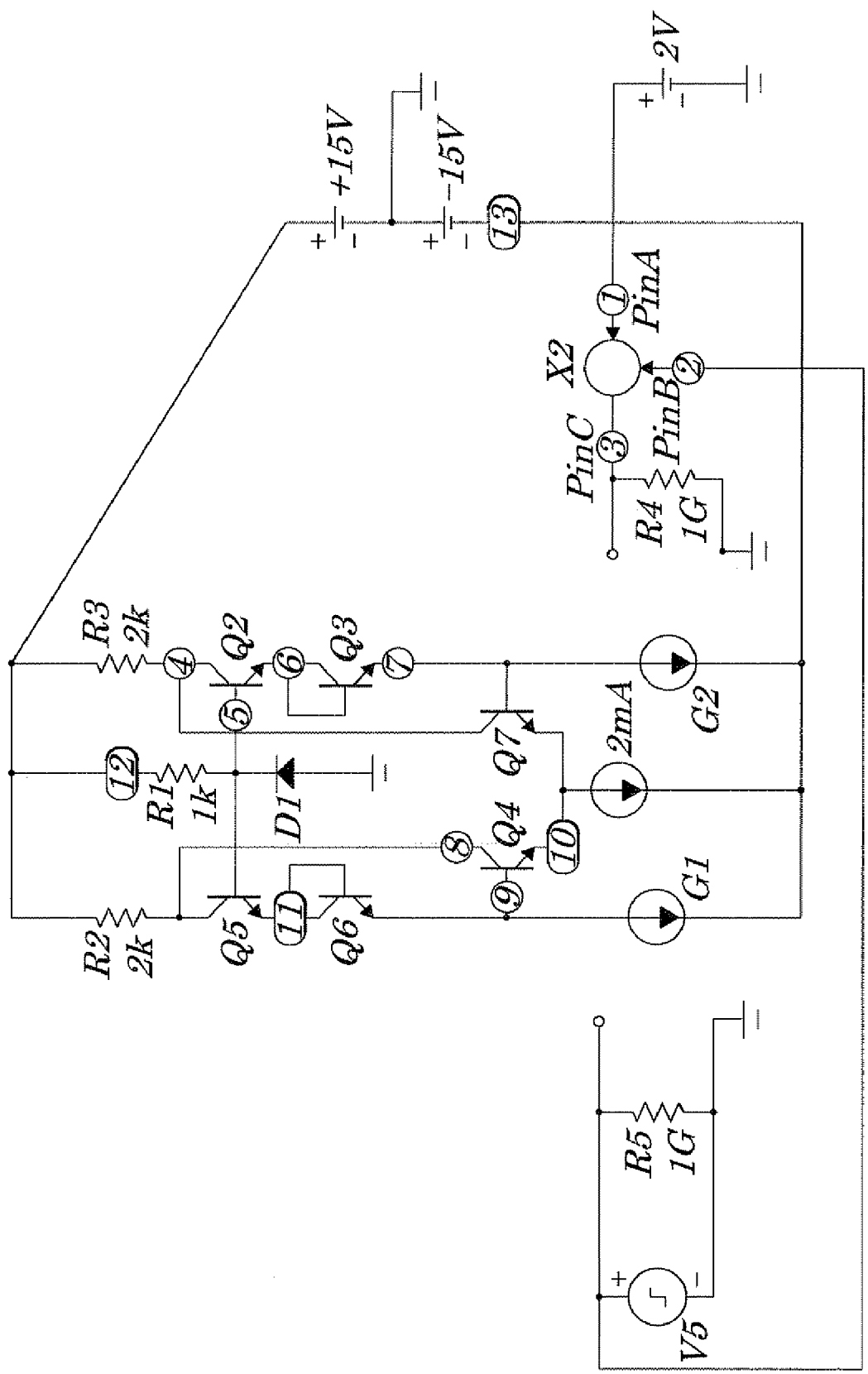
FIG. 2 is a circuit diagram showing configurations of a SIN wave generating circuit according to the first exemplary embodiment of the present invention.
Figure 3:
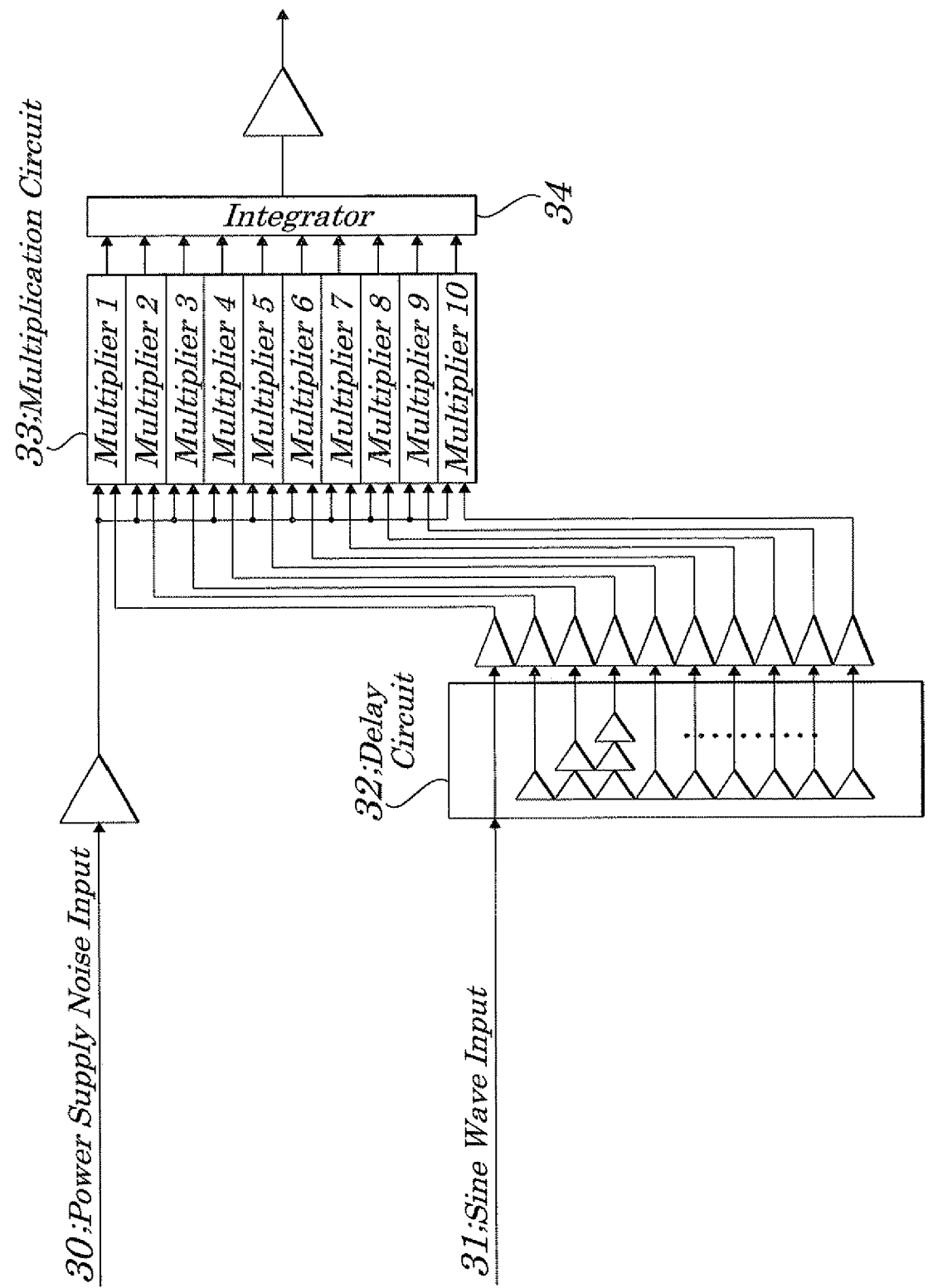
FIG. 3 is a block diagram showing configurations of across-correlation processing circuit according to the first exemplary embodiment of the present invention.
Figure 4A:
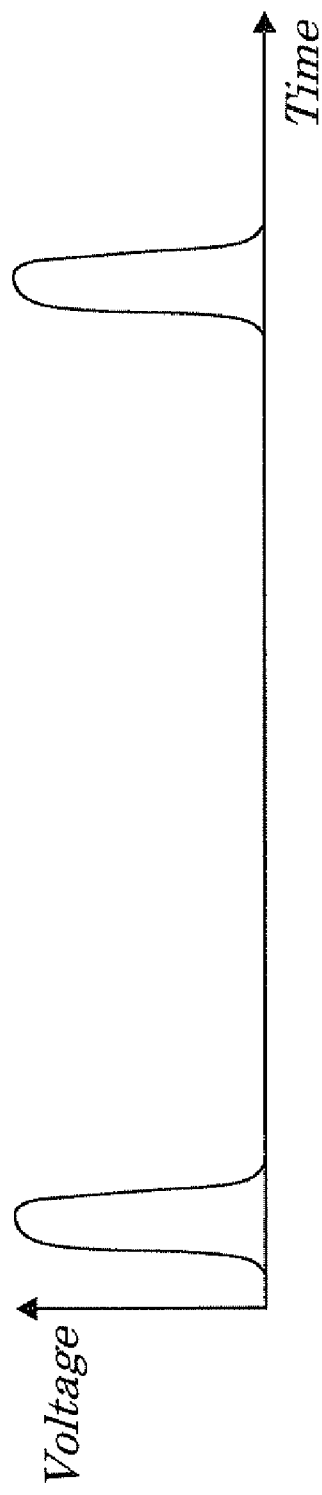
FIGS. 4A and 4B are diagrams showing output waveforms of the cross-correlation processing circuit according to the first exemplary embodiment of the present invention.
Figure 4B:
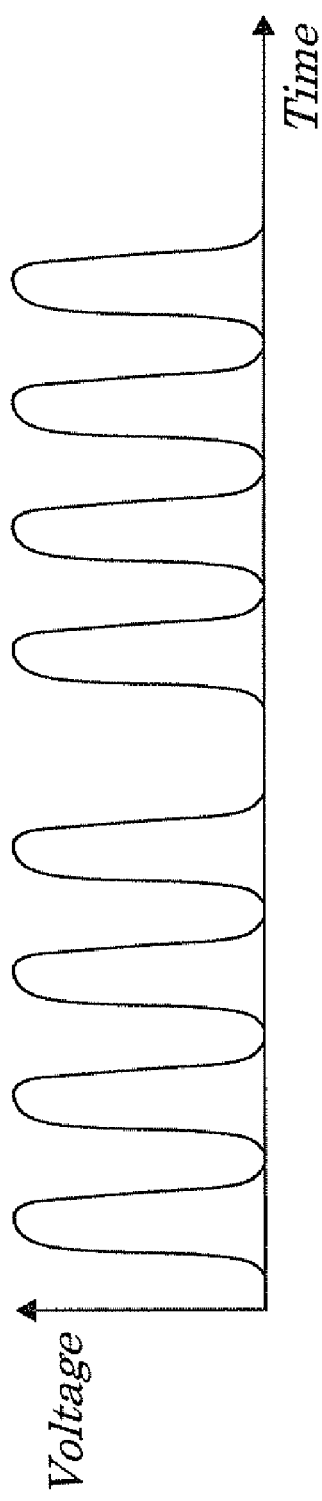
Figure 5A:
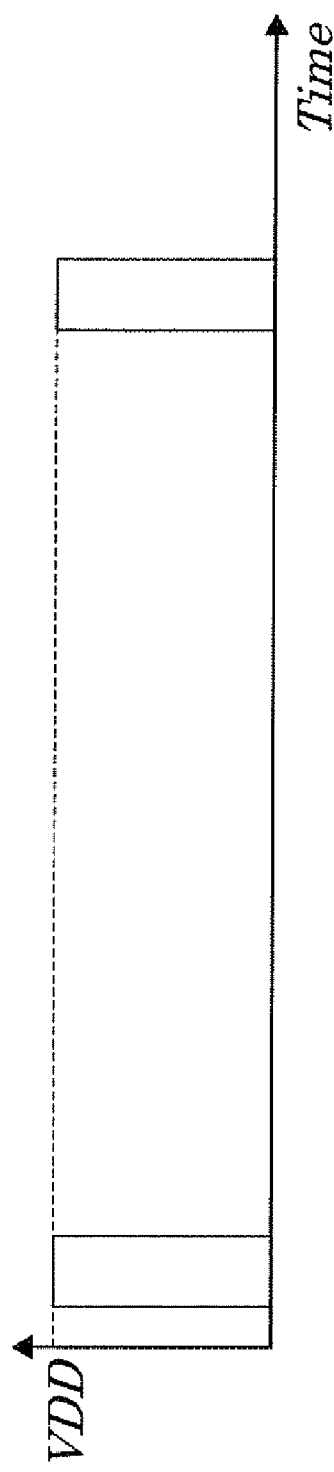
FIGS. 5A and 5B are diagrams showing outputs from a comparator according to the first exemplary embodiment of the present invention.
Figure 5B:
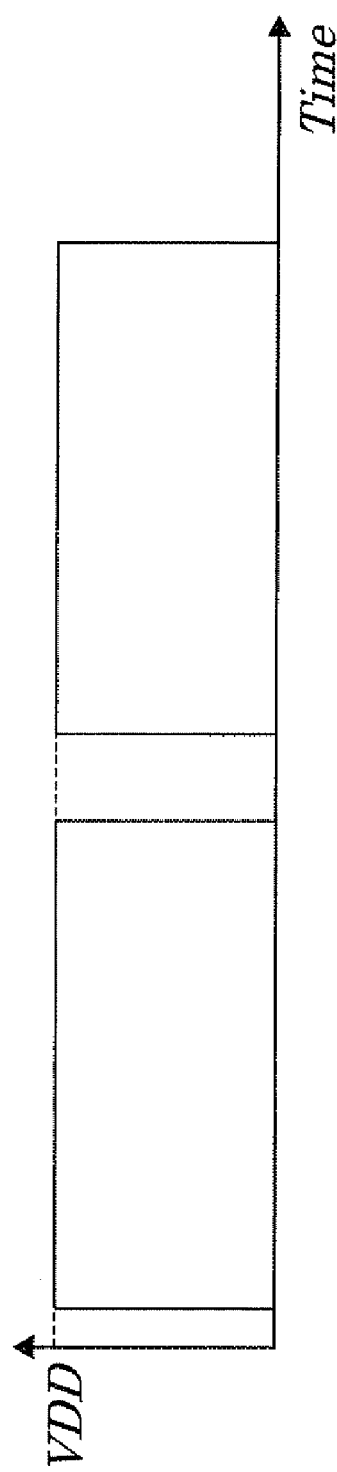

FIG. 1 is a function block diagram showing configurations of an entire power supply noise measuring circuit of the first exemplary embodiment of the present invention. FIG. 2 is a circuit diagram showing configurations of a SIN wave generating circuit of the first exemplary embodiment. FIG. 3 is a block diagram showing configurations of a cross-correlation processing circuit of the first exemplary embodiment. FIGS. 4A and 4B are diagrams showing output waveforms of the cross-correlation processing circuit of the first exemplary embodiment. FIGS. 5A and 5B are diagrams showing outputs from a comparator of the first exemplary embodiment. FIG. 6 is a diagram explaining the extraction of a noise component of the first exemplary embodiment.

The power supply noise measuring circuit, as shown in FIG. 1, includes a SIN (sine) wave generating circuit 11, a cross-correlation processing circuit 12, a comparator 13, and a counter 15. The SIN wave generating circuit 11 switches an oscillating frequency according to control from the outside and generates an output made up of a sine wave an amplitude of which shows a power supply voltage (VDD). The cross-correlation processing circuit 12 calculates a cross-correlation function between power supply noise 10 and a sine wave fed from the SIN wave generating circuit. The comparator 13 is made up of a comparator circuit and compares an output obtained by calculating a cross-correlation function fed from the cross-correlation processing circuit 12 with a threshold value 14 being a reference value to generate an output according to a period during which the output exceeds a threshold value. The counter 15, while resetting a reset signal 16 generated according to a period of measuring power supply noise every time the reset signal is input, counts the number of times of occurrences of an output from the comparator 13 to output a count value.

In general, a cross-correlation function can be shown by the following equation:

$$Rxy(j)[1/(N-j)]x\Sigma x(i)\cdot y(i+j) j=0, 1, 2, \ldots, N-1 \qquad (1)$$

where x and y are two signals each having correlation to each other and i and j are the number of the sampling points which are a function of time. The equation (1) shows that sampling is performed at an "i" point with respect to the signal x and at "i" and "j" points with respect to the signal y.

By calculating and outputting the degree of correlation between two signals of x and y using the equation (1), to what degree the frequency components of the signals x and y are contained can be understood. For example, if the signals x and y have completely the same waveforms, the component of the signal x appears in every period and, if the signal x has a waveform obtained by shifting the phase of the signal y by π/2, the component of the signal x appears only in the position where the phase has been shifted. Then, to what degree the frequency component generated by the SIN wave generating circuit 11 is contained in the power supply noise 10 is calculated and, if many components of the frequency generated by the SIN wave generating circuit are contained, the number of times of occurrences of outputs, from the comparator 13, obtained by detecting that the output of the cross-correlation processing circuit 12 has exceeded the threshold value 14 becomes large and, if the components of the frequency generated by the SIN wave generating circuit are not contained at all, the output of "0" continues.

The power supply noise measuring circuit of the exemplary embodiment includes the SIN wave generating circuit 11 having such configurations as shown in FIG. 2. The SIN wave generating circuit 11, as shown in FIG. 2, is so configured to obtain an output of a sine wave by taking out, via a differential circuit or a like, voltages generated at points ④ to ⑧ according to an input produced by a process in which currents flowing through current sources G2 and G3 are controlled by pulse voltage sources ② and ③. Therefore, the SIN wave generating circuit 11 has a function of generating a sine wave output in amplitude equal to a power supply voltage (VDD) while an oscillating frequency is being switched according to a control from the outside. Since this circuit is already known, its detailed descriptions are omitted hereinafter. The SIN wave generating circuit shown in FIG. 2 is one example and the present invention is not limited to this.

FIG. 3 shows an example of configurations of the cross-correlation processing circuit 12 shown in FIG. 1, which is so designed that sampling is set at 10 sampling points (that is, N=10) and the SIN wave generating circuit 11 produces a sine wave corresponding to one period at 10 sampling points. In the circuit shown in FIG. 3, a sine wave input 31 fed from the SIN wave generating circuit 11 is sequentially delayed by a delay circuit 32 in 10 steps in a manner to correspond to each of the 10 sampling points and each of delayed results is input, together with power supply noise input 30, successively, to each of multipliers 1 to 10 making up a multiplication circuit 33 to perform a multiplication and each of results from the multiplication is integrated by an integrator and, as a result, the cross-correlation function is outputted.

FIGS. 4A and 4B are examples of outputs from the cross-correlation processing circuit 12 in FIG. 4A is an example in which a degree of correlation between power supply noise 10 and a sine wave input fed from the SIN wave generating circuit 11 is low and in which a coarse sine wave output is obtained. FIG. 4B is an example in which a degree of correlation between power supply noise and a sine wave input is high and in which sine wave outputs are successively obtained.

At this time point, by providing the comparator 13 at a front stage of the counter 15, whether or not the output voltage from the cross-correlation processing circuit 12 has exceeded a threshold value is judged. For example, in case the threshold value is set at VDD/2, an output from the comparator 13 is shown in FIG. 5. FIG. 5A shows a case where a degree of correlation is low and where a binary "1" is seldom output and FIG. 5B shows a case where a degree of correlation is high and where a binary "1" is frequently output.

Moreover, the counter 15 counts the number of times when an output from the comparator 13 becomes high. In this case, any given measurement time can be set and, every time the reset signal 16 is input, a previous measurement result is reset and a succeeding measurement starts newly. In this case, it is desirous that the measurement time is set depending on how frequencies of appearance of critical noise frequency components affect a delay of a logic signal caused by a time delay occurring when a logic signal is transferred between flip flop devices (FFs) at a previous stage and a FF at a succeeding stage in an LSI. In the example shown in FIG. 5, when the measurement period is 9T (T denotes time of one period of a sine wave), the count value of the counter 15 is two when a degree of correlation is low and is eight when a degree of correlation is high. The above critical noise frequency components seriously affect operations of a logic circuit having a delay path providing the longest signal delay and operations of analog circuits and, therefore, by verifying the frequencies of appearance based on a degree of correlation, effective countermeasure and design manual against power supply noise to be used in object circuits can be realized.

There is provided the freedom to totalize the noise frequency components at what noise frequency by selecting an oscillating frequency of the SIN wave generating circuit 11. In the power supply noise measuring circuit of the first exemplary embodiment, as shown in FIG. 6, by setting the oscillating frequency of the SIN wave generating circuit 11 at a frequency of a global clock, a noise component adversely affecting a frequency of a local clock in a data path is extracted.

As described above, a period of the local clock used to operate the data path or a like is ordinarily ½ times longer than that of a global clock and, as shown in FIG. 6, the power supply noise caused by the global clock is superimposed greatly on the local clock in every other period. As a result, jitters of the local clock greatly differ in every other periods and, therefore, a differential between local clock periods becomes large.

When a logic signal is transferred within an LSI, it is important that a data signal has arrived before a succeeding clock arrives in each of the FFs. However, if a clock is accompanied with a jitter, fluctuations occur in timing when the clock arrives and, therefore, when delay time of data is designed, a wide margin is required and the degree of freedom of delay designing to be taken into consideration at a time of timing designing becomes small. In recent years, since a period of 1 cycle (1T) for transmission of a logic signal within an LSI is becoming short, by making a clock to originally be a reference for signal transmission have time fluctuation, an excessive margin is required in terms of delay designing of data and, therefore, the degree of freedom of delay designing to be taken into consideration at the time of timing designing becomes small. Therefore, by probing (analyzing) a noise having a frequency component of the global clock, it is made possible to indirectly verify a timing jitter of a local clock.

Thus, according to the power supply noise measuring circuit of the first exemplary embodiment, an analysis on frequency components at which an LSI is most seriously affected by power supply noise is contained in noise components is made possible by measuring an amount of noise that practically affects circuits, an effective countermeasure and design manual against power supply noise can be realized. Moreover, since a case occurs where a designing margin can be mitigated, it is possible to achieve low-cost designing.

Second Exemplary Embodiment

Figure 7:
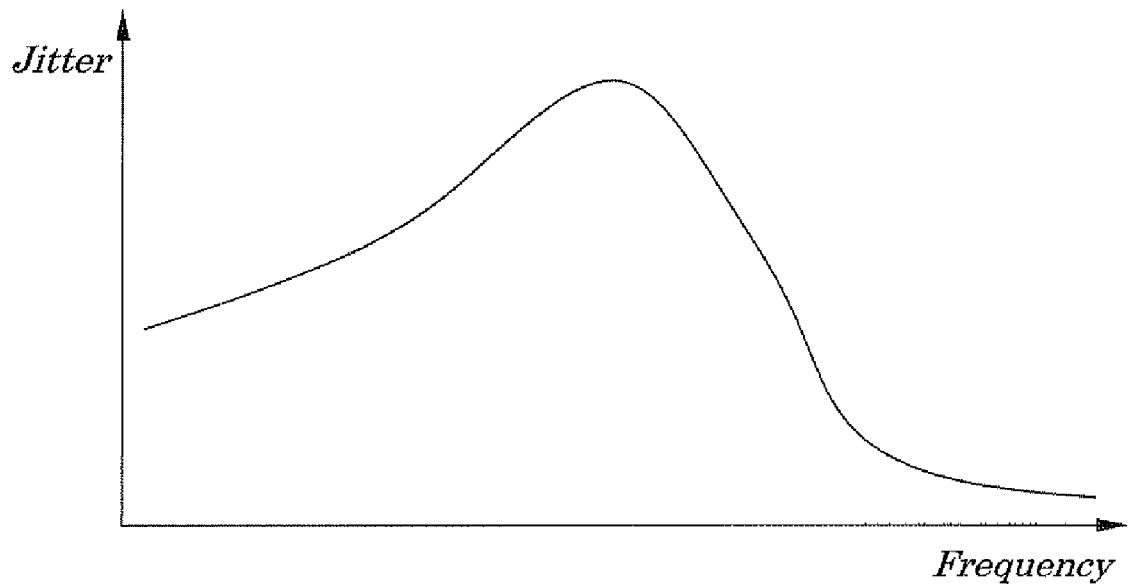
FIG. 7 is a diagram showing a characteristic of a frequency of a jitter in a PLL (Phase-Locked Loop) circuit.
Figure 8:
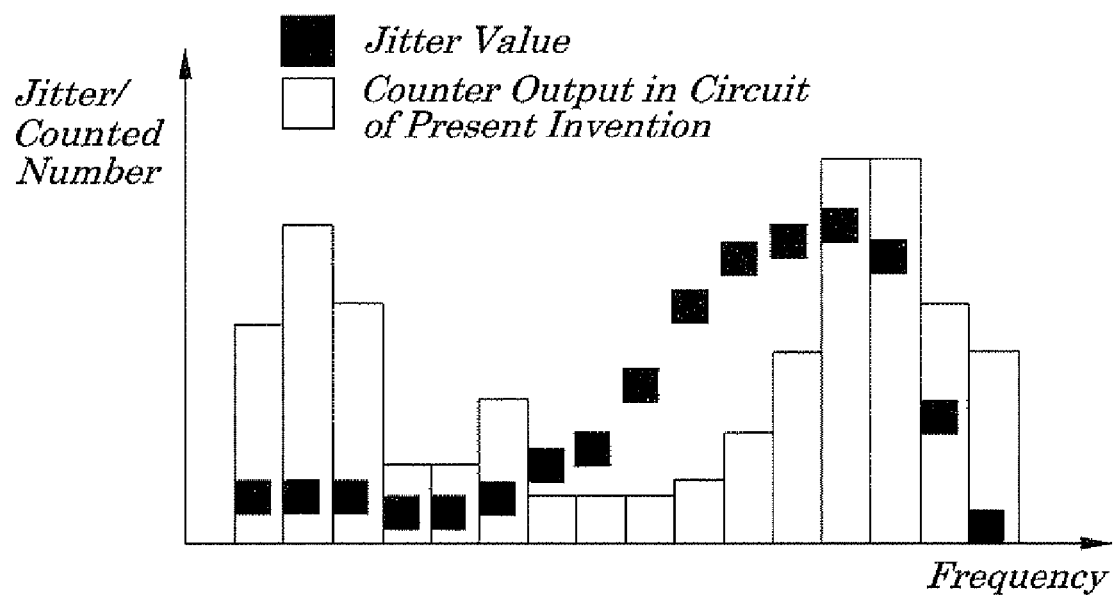
FIG. 8 is a diagram showing an example of a relation between a jitter value in the PLL circuit and a counted value of a counter.
Figure 9A:
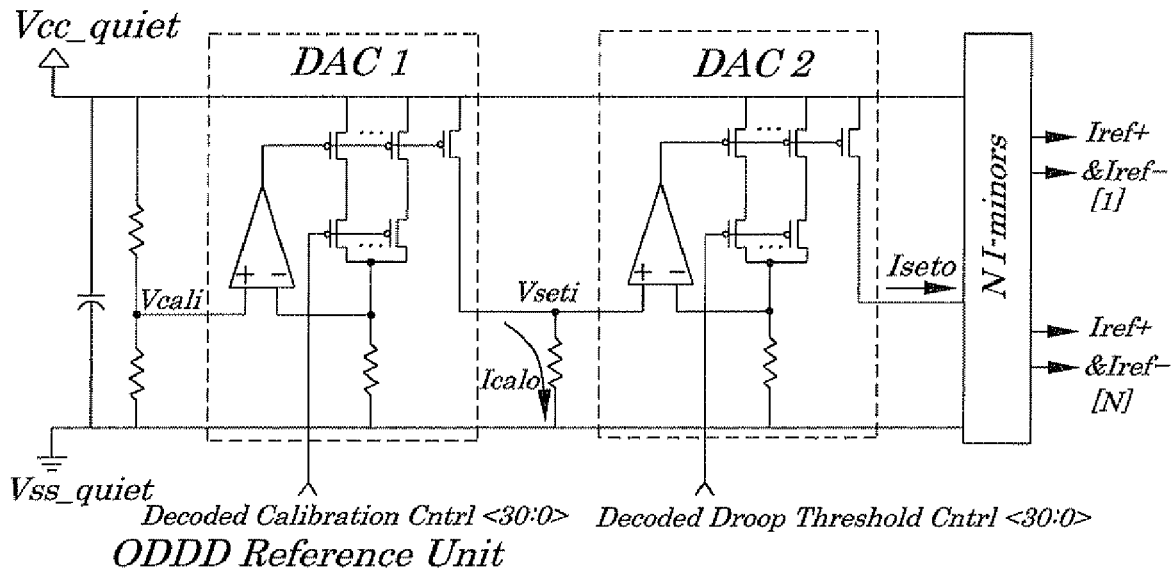
FIGS. 9A and 9B are diagrams showing circuits disclosed by Ali Muhtaroglu et. al of INTEL at the VLSI (Very-Large-Scale Integration) Symposium 2003.
Figure 9B:
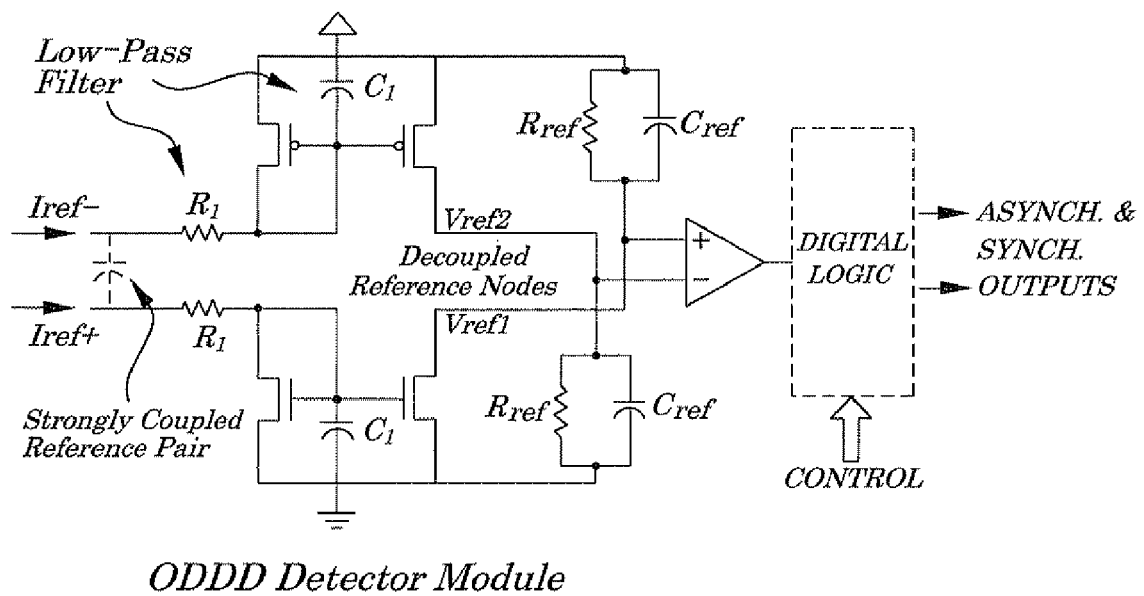
Figure 10:
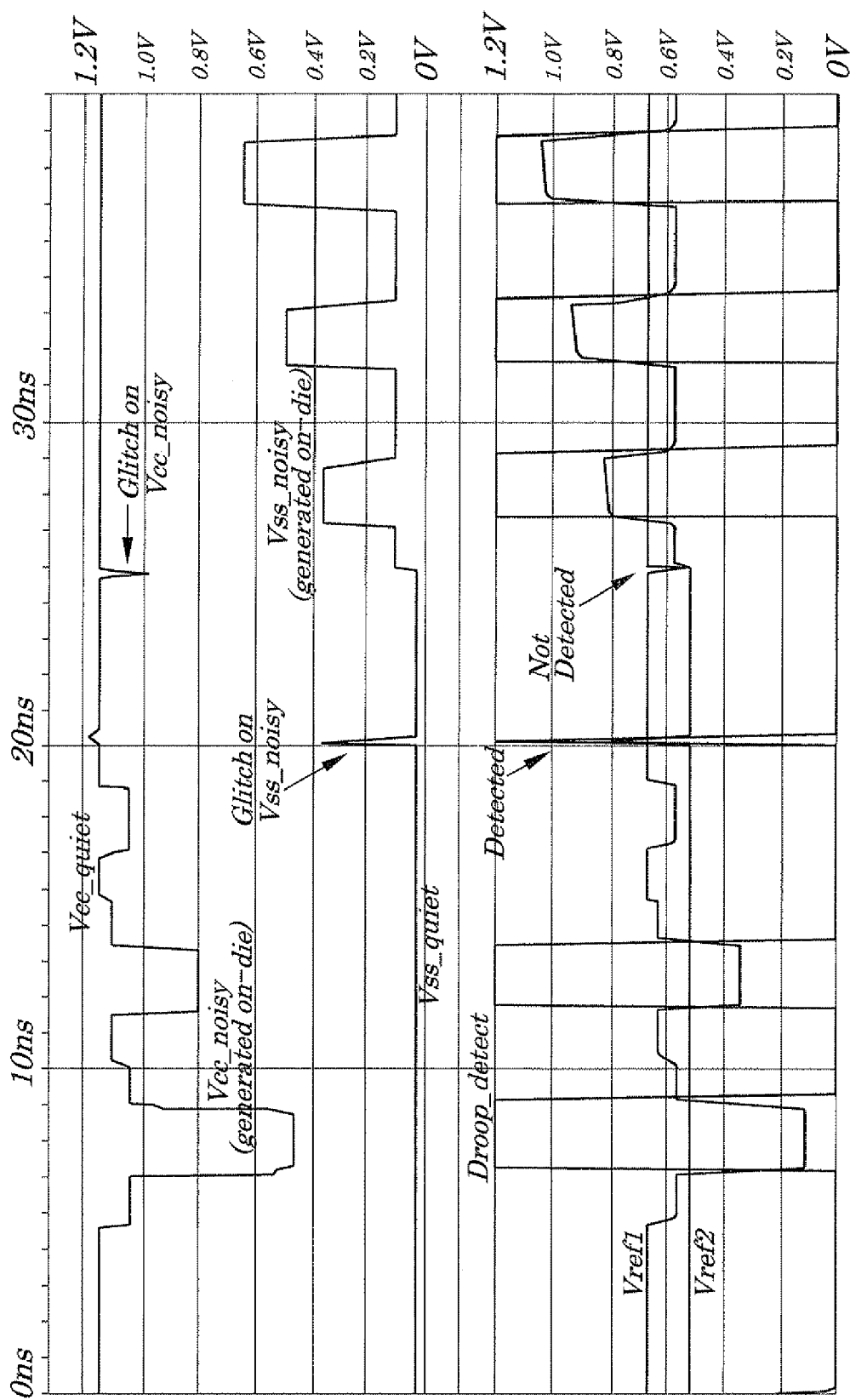
FIG. 10 is a diagram showing results from measurement of noise amounts by using the circuit of FIGS. 9A and 9B.
Figure 11A:
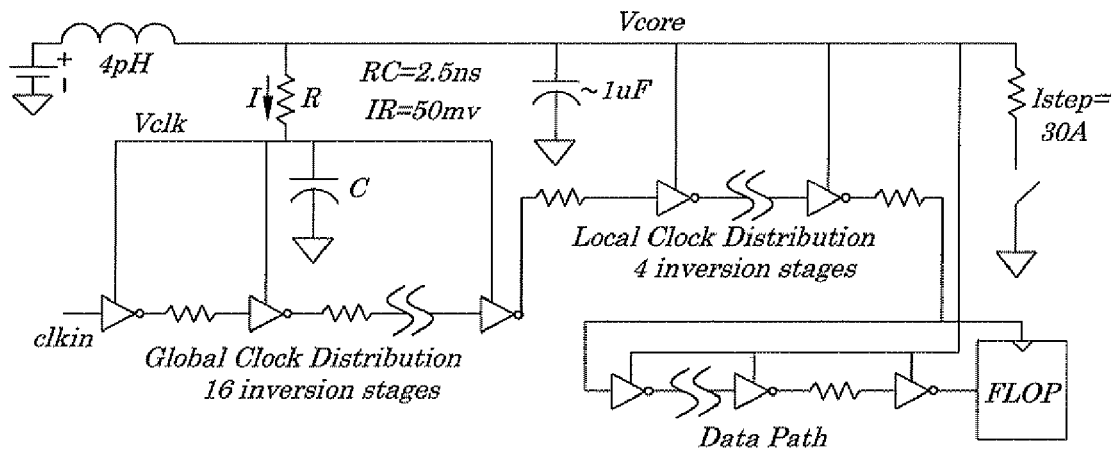
FIGS. 11A and 11B are diagrams showing circuits disclosed by Tawfik Rahal-Arabi et. al of INTEL at the VLSI Symposium 2005.
Figure 11B:
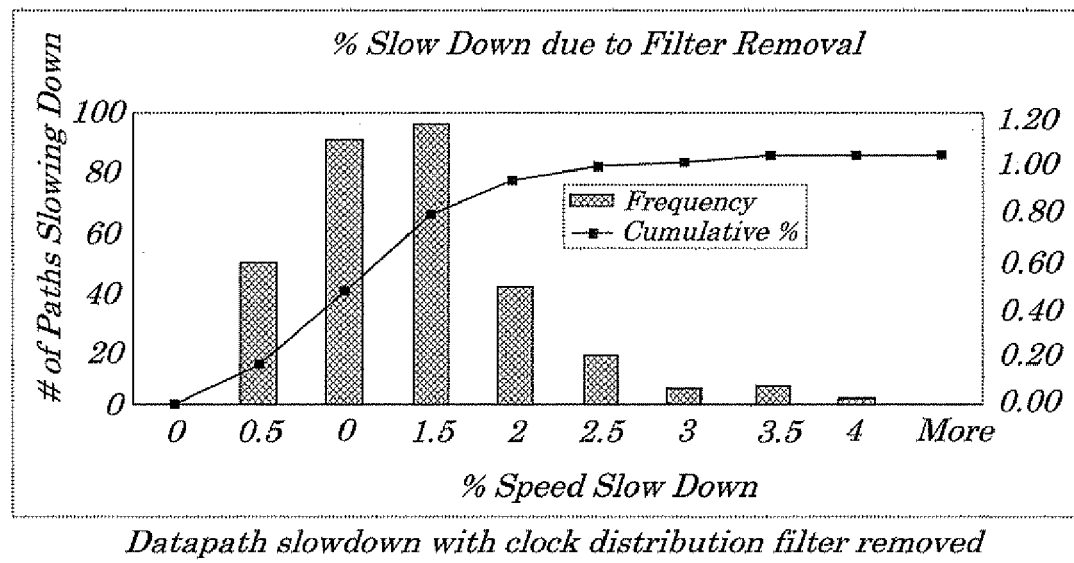

FIG. 7 is a diagram showing a characteristic of a frequency of a jitter in a PLL (Phase-Locked Loop) circuit. FIG. 8 is a diagram showing an example of a relation between a jitter value in the PLL circuit and a counted number of the counter 15. Hereinafter, a power supply noise measuring circuit of the second exemplary embodiment is described by referring to FIGS. 7 and 8. The power supply noise measuring circuit can be suitably used in the PLL circuit and configurations of the power supply noise measuring circuit are the same as those shown in FIG. 1 and its descriptions are omitted accordingly.

The PLL circuit is a circuit being sensitive to a noise frequency in particular. As shown in FIG. 7, a jitter value in an output of the PLL circuit (not shown) changes greatly depending on a power supply noise frequency. Such a circuit characteristic as described above can be obtained by simulation at a time of designing the PLL circuit. By selecting a power supply noise frequency greatly affecting operations of the PLL circuit on the basis of the simulation results and by setting the selected frequency as an oscillating frequency of the SIN wave generating circuit 11 shown in FIG. 1, it is made possible to effectively detect a power supply noise required for operational stability of the PLL circuit.

Moreover, the results from the simulation can be verified simply by observing a jitter value of the PLL circuit obtained when a sine wave oscillating frequency of a SIN wave generating circuit 11 shown in FIG. 1 is changed in every some frequencies, which enables noise sensitivity to jitters in an output from the PLL circuit to be detected. FIG. 8 shows a relation between a jitter value of an output from the PLL circuit and an output from the counter 15 in the power supply noise measuring circuit shown in FIG. 1 in which the symbol (■) represents jitter values of the PLL circuit and the symbol (□) represents counted values output from the counter 15 obtained in the power supply noise measuring circuit of the second exemplary embodiment. In the relation between the jitter values and counted values from the counter 15 shown in FIG. 8, the state in which a jitter value is large though the counted value is small represents a power supply noise frequency having noise sensitivity. As shown by results in FIG. 8, for example, by dividing a jitter value by a counted value, measurement of relative noise sensitivity is made possible.

Thus, according to the power supply noise measuring circuit of the second exemplary embodiment, an analysis on frequency components at which the PLL circuit is most seriously affected by power supply noise is made possible and, by measuring an amount of noise that practically affects the PLL circuit, an effective countermeasure and design manual against noises can be realized. As a result, in some cases, a design margin can be mitigated, which may result in a low-cost designing. Moreover, the noise sensitivity characteristic of the PLL circuit employed in the above second exemplary embodiment is one of examples that can be used for the present invention and changes depending on a circuit to be designed, however, an effect of obtaining an efficient countermeasure against power supply noise can be achieved in any characteristic of a circuit.

While the invention has been particularly shown and described with reference to exemplary embodiments thereof, the invention is not limited to theses embodiments. It will be understood by those of ordinary skill in the art that various changes in form and details may be made therein without departing from the sprit and scope of the present invention as defined by the claims.

In the foregoing, a preferable exemplary embodiment is one wherein an amplitude of a sine wave signal output from the sine wave generating circuit is a power supply voltage and the threshold voltage is set so as to be a half of the power supply voltage.

Also, a preferable exemplary embodiment is one wherein the counter performs the counting while resetting a previous result from the counting in every input of a reset signal.

Also, a preferable exemplary embodiment is one wherein a period of the reset signal is able to be set according to a frequency of occurrence of a noise frequency component affecting a delay in a logic circuit and/or an operation of an analog circuit.

Also, a preferable exemplary embodiment is one wherein the sine wave generating circuit generates a sine wave having a frequency of a global clock being a half of a frequency of a local clock in a data path.

Furthermore, a preferable exemplary embodiment is one wherein the analog circuit is a PLL (Phase-Locked Loop) circuit.

For example, configurations of the SIN wave generating circuit 11, cross-correlation processing circuit 12, or the like shown in the above exemplary embodiments are examples that can be employed in the power supply noise measuring circuit of the present invention and any circuit can be used so long as the circuit has performance and function equal to the above circuits. Also, in the above exemplary embodiment, a frequency of a global clock is used for determining a noise frequency to be used for the noise measurement, however, the present invention is not limited to this and other frequency may be selected according to applications. The period of time for measuring noise and method for setting a threshold value for a cross-correlation function output are not limited to those shown in the above exemplary embodiments and any measuring period of time and any method may be used so long as the equal effects are expected. Moreover, by inserting a power supply filter into a power supply portion of the power supply noise measuring circuit, power can be supplied from a core logic power supply, which adds the degree of freedom to the selection of mounting places.

Furthermore, the power supply noise measuring circuit and the measuring method of the present invention can be widely applied to devices and apparatuses requiring the consideration for power supply noises at a time of designing such as computers, network devices, digital household electrical appliance, a mobile household electrical appliance.

What is claimed is:

1. A power supply noise measuring circuit comprising:
   a sine wave generating circuit which generates a sine wave signal having a variable frequency in a constant amplitude,
   a cross-correlation function calculating circuit which calculates and output a cross-correlation function between a power supply noise and a sine wave signal fed from said sine wave generating circuit,
   a comparator which compares an output of said cross-correlation function with a specified threshold voltage and which produces an output when said output of said cross-correlation function has exceeded said threshold voltage, and
   a counter which counts the number of occurrences of an output from said comparator within a predetermined period of time;
   wherein said power supply noise measuring circuit is configured so as to verify a noise frequency component affecting a delay in a logic circuit and/or an operation of an analog circuit by changing a sine wave frequency of said sine wave generating circuit based on results from counting done by said counter.

2. The power supply noise measuring circuit according to claim 1, wherein an amplitude of a sine wave signal output from said sine wave generating circuit is a power supply voltage and said threshold voltage is set so as to be a half of said power supply voltage.

3. The power supply noise measuring circuit according to claim 1, wherein said counter performs said counting while resetting a previous result from said counting in every input of a reset signal.

4. The power supply noise measuring circuit according to claim 1, wherein a period of said reset signal is able to be set according to a frequency of occurrence of a noise frequency component affecting a delay in a logic circuit and/or an operation of an analog circuit.

5. The power supply noise measuring circuit according to claim 1, wherein said sine wave generating circuit generates a sine wave having a frequency of a global clock being a half of a frequency of a local clock in a data path.

6. The power supply noise measuring circuit according to claim 1, wherein said analog circuit is a PLL (Phase-Locked Loop) circuit.

7. A power supply noise measuring method comprising:
generating a sine wave signal having a variable frequency in a constant amplitude,
calculating and outputting a cross-correlation function between power supply noise and said sine wave signal;
comparing an output of said cross-correlation function with a specified threshold voltage and producing an output showing detection that said output of said cross-correlation function has exceeded said threshold voltage, and
counting the number of occurrences of said output showing the detection within a predetermined period of time;
wherein a noise frequency component affecting a delay in a logic circuit and/or an operation of an analog circuit is verified by changing a sine wave frequency based on results from said counting.

8. The power supply noise measuring method according to claim 7, wherein an amplitude of a sine wave signal is a power supply voltage and said threshold voltage is set so as to be a half of said power supply voltage.

9. The power supply noise measuring method according to claim 7, wherein said counting is carried out while a previous result from said counting is being reset in every input of a reset signal.

10. The power supply noise measuring method according to claim 7, wherein a period of said reset signal is set according to a frequency of occurrence of a noise frequency component affecting a delay in a logic circuit and/or an operation of an analog circuit.

11. The power supply noise measuring method according to claim 7, wherein a sine wave having a frequency of a global clock being a half of a frequency of a local clock in a data path is generated as said sine wave signal.

12. The power supply noise measuring method according to claim 7, wherein said analog circuit is a PLL (Phase-Locked Loop) circuit.

13. A power supply noise measuring circuit comprising:
a sine wave generating means which generates a sine wave signal having a variable frequency in constant amplitude,
a cross-correlation function calculating means which calculates and output across-correlation function between a power supply noise and a sine wave signal fed from said sine wave generating means,
a comparing means which compares an output of said cross-correlation function with a specified threshold voltage and which produces an output when said output of said cross-correlation function has exceeded said threshold voltage, and
a counting means which counts the number of occurrences of an output from said comparing means within a predetermined period of time;
wherein said power supply noise measuring circuit is configured so as to verify a noise frequency component affecting a delay in a logic circuit and/or an operation of an analog circuit by changing a sine wave frequency of said sine wave generating means based on results from counting done by said counting means.

14. The power supply noise measuring circuit according to claim 13, wherein amplitude of a sine wave signal output from said sine wave generating means is a power supply voltage and said threshold voltage is set so as to be a half of said power supply voltage.

15. The power supply noise measuring circuit according to claim 13, wherein said counting means performs said counting while resetting a previous result from said counting in every input of a reset signal.

16. The power supply noise measuring circuit according to claim 13, wherein a period of said reset signal is able to be set according to a frequency of occurrence of a noise frequency component affecting a delay in a logic circuit and/or an operation of an analog circuit.

17. The power supply noise measuring circuit according to claim 13, wherein said sine wave generating means generates a sine wave having a frequency of a global clock being a half of a frequency of a local clock in a data path.

18. The power supply noise measuring circuit according to claim 13, wherein said analog circuit is a PLL (Phase-Locked Loop) circuit.

* * * * *